United States Patent
Kim et al.

(10) Patent No.: US 9,843,021 B2
(45) Date of Patent: Dec. 12, 2017

(54) METHOD OF MANUFACTURING DISPLAY DEVICE

(71) Applicant: SAMSUNG DISPLAY CO., LTD., Yongin-si, Gyeonggi-do (KR)

(72) Inventors: Yongtack Kim, Yongin-si (KR); Yoonhyeung Cho, Yongin-si (KR); Hakjoong Yong, Yongin-si (KR); Deokchan Yoon, Yongin-si (KR); Heungkyoon Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/267,051

(22) Filed: Sep. 15, 2016

(65) Prior Publication Data

US 2017/0256739 A1   Sep. 7, 2017

(30) Foreign Application Priority Data

Mar. 2, 2016   (KR) .......................... 10-2016-0025032

(51) Int. Cl.
*H01L 51/52* (2006.01)
*G02F 1/1333* (2006.01)
*H01L 51/56* (2006.01)

(52) U.S. Cl.
CPC .... *H01L 51/5253* (2013.01); *G02F 1/133308* (2013.01); *H01L 51/56* (2013.01); *G02F 2001/133311* (2013.01)

(58) Field of Classification Search
CPC combination set(s) only.
See application file for complete search history.

(56) References Cited

U.S. PATENT DOCUMENTS

| 8,461,760 B1 | 6/2013 | Oh et al. | |
|---|---|---|---|
| 2009/0110917 A1* | 4/2009 | Albaugh | H01L 23/296 428/336 |
| 2011/0291119 A1* | 12/2011 | Ryu | H01L 27/3276 257/88 |

(Continued)

FOREIGN PATENT DOCUMENTS

| KR | 10-1218115 B1 | 1/2013 |
|---|---|---|
| KR | 10-2013-0128689 A | 11/2013 |

(Continued)

*Primary Examiner* — Mamadou Diallo
(74) *Attorney, Agent, or Firm* — Lewis Roca Rothgerber Christie LLP

(57) ABSTRACT

A method of manufacturing a display device includes forming a display portion on a substrate, and forming an encapsulation portion for sealing the display portion. The forming of the encapsulation portion includes forming a first layer covering the display portion, forming a second layer on the first layer, and forming a third layer on the second layer. The first layer is formed by maintaining a distance between an upper surface of the display portion and a mask by a first interval. The second layer is formed by maintaining a distance between an upper surface of the first layer and the mask by a second interval that is different from the first interval. The third layer is formed by maintaining a distance between an upper surface of the second layer and the mask by a third interval that is different from the second interval.

25 Claims, 11 Drawing Sheets

(56) References Cited

U.S. PATENT DOCUMENTS

| | | | |
|---|---|---|---|
| 2014/0151656 A1* | 6/2014 | Zeng | H01L 51/5253 |
| | | | 257/40 |
| 2014/0299859 A1 | 10/2014 | Chen et al. | |
| 2015/0108535 A1* | 4/2015 | Park | H01L 51/5256 |
| | | | 257/100 |

FOREIGN PATENT DOCUMENTS

| | | | |
|---|---|---|---|
| KR | 10-2014-0048096 A | 4/2014 | |
| KR | 10-2015-0049470 A | 5/2015 | |

* cited by examiner

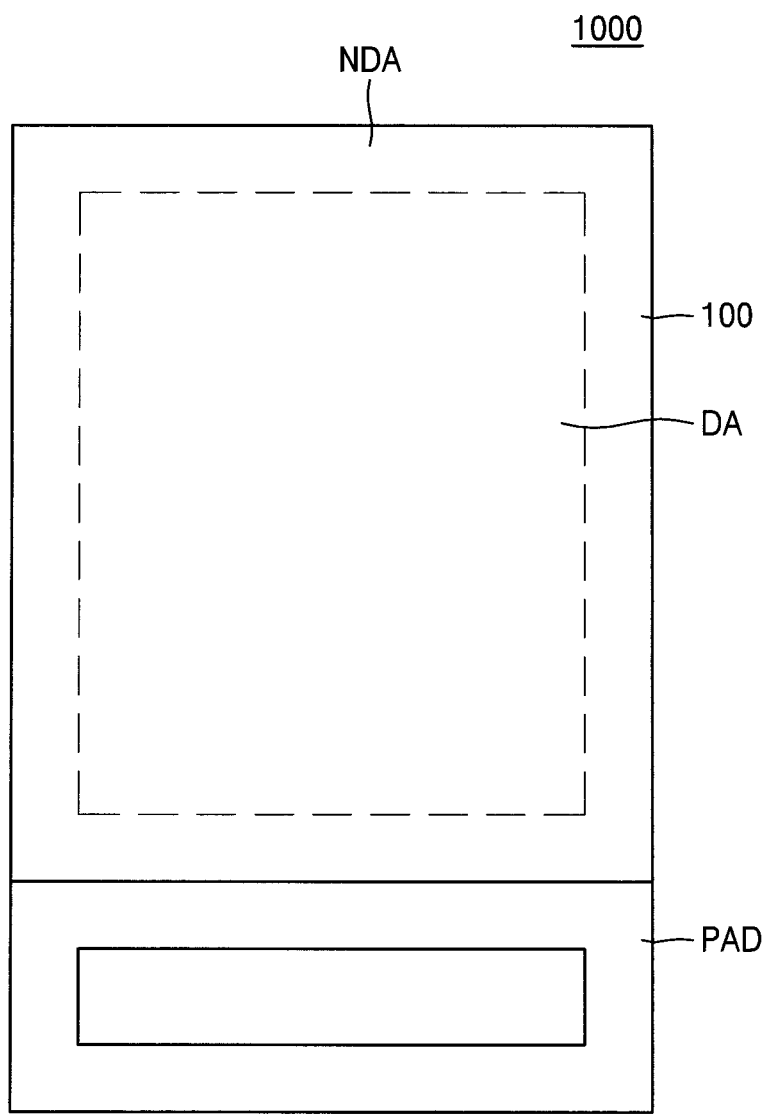

METHOD OF MANUFACTURING DISPLAY DEVICE

CROSS-REFERENCE TO RELATED APPLICATION

This application claims priority to and the benefit of Korean Patent Application No. 10-2016-0025032, filed on Mar. 2, 2016, in the Korean Intellectual Property Office, the entire content of which is incorporated herein by reference.

BACKGROUND

One or more aspects of example embodiments of the present disclosure are related to a method of manufacturing a display device.

With the development of information technology, the market for display devices as a connection medium between users and information has grown. Accordingly, the use of flat panel displays (FPDs) such as liquid crystal displays (LCDs), organic light-emitting diode (OLED) displays, and plasma display panels (PDPs) has increased.

Improvements in display device image quality are required for user convenience, and simplification of processes (e.g., display manufacturing processes) is required for cost reduction.

Protection of a display device from external moisture and/or oxygen may improve the reliability of the display device. However, external moisture and/or oxygen may intrude through a side surface of the display device before and/or when an encapsulation portion for sealing the display device is formed.

SUMMARY

One or more aspects of example embodiments of the present disclosure are directed toward a method of manufacturing a display device, in which a sealing function of the display device is improved and the number of processes is reduced.

Additional aspects will be set forth in part in the description which follows and, in part, will be apparent from the description, or may be learned by practice of the presented embodiments.

One or more example embodiments of the present disclosure provide a method of manufacturing a display device including: forming a display portion on a substrate and forming an encapsulation portion for sealing the display portion, wherein the forming of the encapsulation portion includes forming a first layer covering the display portion; forming a second layer on the first layer; and forming a third layer on the second layer, wherein the first layer is formed by maintaining a distance of a first interval between an upper surface of the display portion and a mask, the second layer is formed by maintaining a distance of a second interval different from the first interval between an upper surface of the first layer and the mask, and the third layer is formed by maintaining a distance of a third interval different from the second interval between an upper surface of the second layer and the mask.

The first layer and the third layer may each include an inorganic material, and the second layer may include an organic and/or inorganic composite material that is different from the material of each of the first layer and the third layer.

The second layer may include one selected from hexamethyldisiloxane (HMDSO), hexamethyldisilazane (HMDSN), tetramethyldisiloxane (TMDSO), tetraethyl-orthosilicate (TEOS), octamethylcyclotetrasiloxane (OMCTS), and tetraoxymethylcyclotetrasiloxane (TOMCTS).

The inorganic material may be at least one selected from $SiN_x$, $SiO_x$, SiON, SiCN, $TiO_x$, $WO_x$, $SiO_xC_y$, and $SiO_xC_yH_z$.

The first layer, the second layer, and the third layer may each be formed in the same chamber.

Each of the first interval and the third interval may be about 1 μm to 300 μm.

The third interval may be greater than the second interval.

The third interval may be greater than the first interval, and the first interval may be greater than the second interval.

The third layer and the first layer may be formed such that edges of the third layer and the first layer contact each other, and the third layer and the first layer may encompass (e.g., encapsulate or surround) the second layer.

A width of the third layer may be greater than a width of the first layer, and the third layer may contact the substrate at an edge of the first layer.

The second layer may be formed when the mask contacts the upper surface of the first layer.

The third interval may be the same as the first interval.

The third layer and the first layer may be formed such that the edges of the third layer and the first layer contact each other, and the third layer and the first layer may encompass (e.g., encapsulate or surround) the second layer.

The second layer may be formed when the mask contacts the upper surface of the first layer.

The second interval may be greater than the first interval.

Each of the first layer, the second layer, and the third layer may have an edge contacting an outer region of the substrate.

The substrate, the first layer, and the third layer may encompass (e.g., encapsulate or surround) the second layer.

A difference between the second interval and the first interval and a difference between the third interval and the second interval may each be less than or equal to 1 mm.

The display portion may include a thin film transistor and a display element electrically connected to the thin film transistor, and the display element may include an organic light-emitting device including a first electrode electrically connected to the thin film transistor, a second electrode facing the first electrode, and an intermediate layer between the first electrode and the second electrode.

The display portion may further include a protection layer on the second electrode, and the protection layer may include a capping layer and a blocking layer.

The first layer may be formed by maintaining the first interval between an upper surface of the blocking layer and the mask.

One or more embodiments of the present disclosure provide a method of manufacturing a display device including: forming a display portion on a substrate and forming an encapsulation portion for sealing the display portion, wherein the forming the encapsulation portion includes forming a first layer covering the display portion, forming a second layer on the first layer, and forming a third layer on the second layer, wherein the first layer is formed by maintaining a distance of a first interval between an upper surface of the display portion and a mask, the second layer is formed when the mask contacts the upper surface of the first layer, and the third layer is formed by maintaining a distance of a third interval between an upper surface of the second layer and the mask.

The first layer and the third layer may each include an inorganic material, and the second layer may include an organic and/or inorganic composite material that is different from the material of the first layer and the third layer.

The second layer may include at least one selected from hexamethyldisiloxane (HMDSO), hexamethyldisilazane (HMDSN), tetramethyldisiloxane (TMDSO), tetraethylorthosilicate (TEOS), octamethylcyclotetrasiloxane (OMCTS), and tetraoxymethylcyclotetrasiloxane (TOMCTS).

The third layer and the first layer may be formed such that the edges of the third layer and the first layer contact each other, and the third layer and the first layer encompass (e.g., encapsulate or surround) the second layer.

BRIEF DESCRIPTION OF THE DRAWINGS

These and/or other aspects will become apparent and more readily appreciated from the following description of the example embodiments, taken in conjunction with the accompanying drawings in which:

FIG. 1 is a plan view of a display device manufactured by a method according to an embodiment of the present disclosure;

DETAILED DESCRIPTION

Figure 2A:
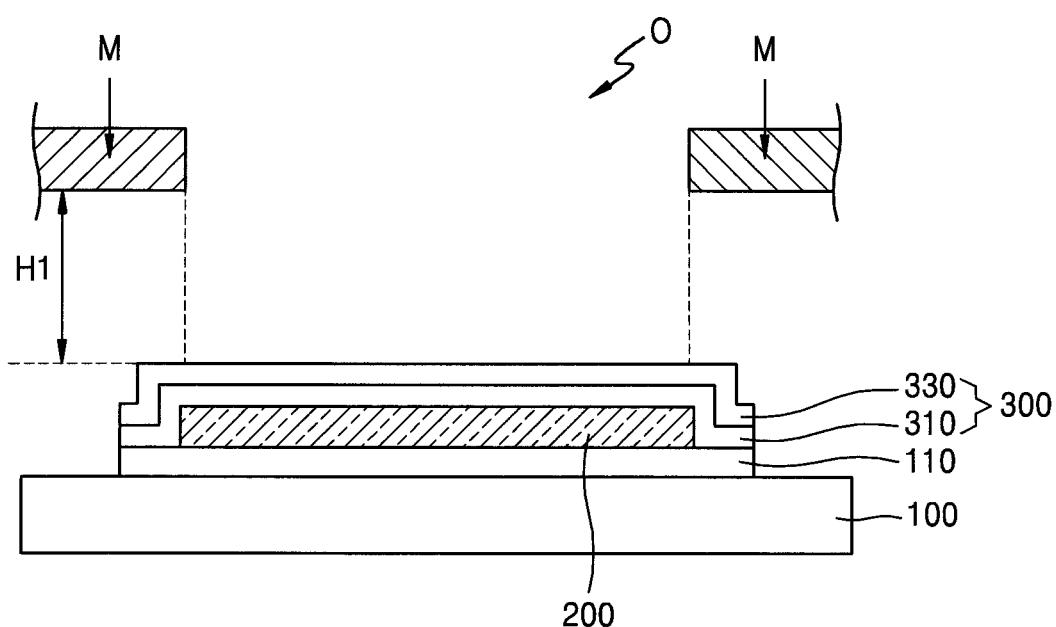
FIGS. 2A to 2F are cross-sectional views sequentially illustrating a method of manufacturing a display device, according to an embodiment of the present disclosure.

Reference will now be made in more detail to example embodiments, examples of which are illustrated in the accompanying drawings, wherein like reference numerals refer to like elements throughout and duplicative descriptions thereof may not be provided. In this regard, the present embodiments may have different forms and should not be construed as being limited to the descriptions set forth herein. Accordingly, the example embodiments are merely described below, by referring to the drawings, to explain aspects of the present description. As used herein, the term "and/or" includes any and all combinations of one or more of the associated listed items. Expressions such as "at least one of", "one of", and "selected from", when preceding a list of elements, modify the entire list of elements and do not modify the individual elements of the list.

Example embodiments are provided to further explain the present disclosure to one of ordinary skill in the art to which the present disclosure pertains. However, embodiments of the present disclosure are not limited thereto, and it will be understood that various changes in form and details may be made therein without departing from the spirit and scope of the following claims. For example, descriptions of particular structures or functions may be presented merely to explain the example embodiments of the present disclosure.

It will be understood that although the terms "first", "second", etc. may be used herein to describe various components, these components should not be limited by these terms. These terms are only used to distinguish one component from another.

As used herein, the singular forms "a", "an", and "the" are intended to include the plural forms as well, unless the context clearly indicates otherwise.

Also, terms such as "include" or "comprise" may be construed to denote the existence or addition of a specific characteristic, number, process, operation, constituent element, or a combination thereof, but may not be construed to exclude the existence or possibility of addition of one or more other characteristics, numbers, processes, operations, constituent elements, or combinations thereof.

In the following description, when a layer is described to exist "on" or "above" another layer, the layer may exist directly on the other layer, or a third layer such as a film, an area, or a constituent element may be interposed therebetween.

Also, in the drawings, the thickness or size of each layer illustrated in the drawings may be exaggerated for clarity and convenience of explanation. In other words, since sizes and thicknesses of components in the drawings are arbitrarily illustrated for convenience of explanation, the following embodiments are not limited thereto.

When an embodiment may be implemented differently, a process order may be performed differently from the presently described order. For example, two consecutively described processes may be performed substantially at the same time or may be performed in reverse order.

FIG. 1 is a plan view of a display device 1000 manufactured by a method according to an embodiment of the present disclosure.

In one embodiment, a substrate 100 may be formed of one or more suitable flexible materials, for example, a plastic material having superior heat resistance and/or durability.

The substrate 100 may include a display area DA where an image for a user is produced and a non-display area NDA that is outside of the display area DA.

The display area DA may include one or more devices for generating light (such as organic light-emitting devices and/or liquid crystal display devices). A voltage wire for supplying electric power to the display area DA may be in the non-display area NDA.

The non-display area NDA may include a pad portion PAD for transferring an electric signal from a power supply unit or a signal generation unit to the display area DA.

The pad portion PAD may include a driver IC, a pad for connecting the driver IC to a pixel circuit, and/or fan-out wiring.

FIGS. 2A to 2F are cross-sectional views sequentially illustrating a method of manufacturing a display device, according to an embodiment of the present disclosure. FIG. 3 is a cross-sectional view schematically illustrating a display portion in a display device manufactured by a method according to an embodiment of the present disclosure.

Figure 3:
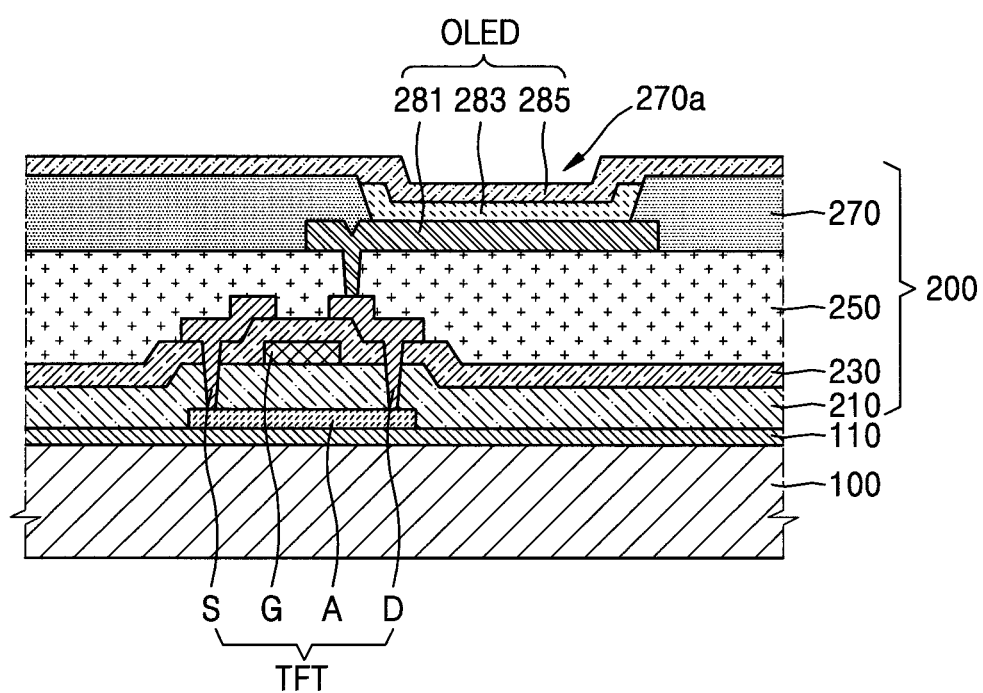
FIG. 3 is a cross-sectional view schematically illustrating a display portion included in a display device manufactured by a method according to an embodiment of the present disclosure.

Referring to FIG. 2A, a buffer layer 110 may be on the substrate 100, and a display portion 200 may be on the buffer layer 110. Although FIG. 2A illustrates an embodiment in which the display portion 200 is on the buffer layer 110, embodiments of the present disclosure are not limited thereto, and the display portion 200 may be directly on the substrate 100.

The substrate 100 may include one or more suitable materials. In one embodiment, the substrate 100 may be formed of a transparent glass material including (e.g., containing) $SiO_2$ as a main ingredient. However, embodiments of the substrate 100 are not necessarily limited thereto, and the substrate may be formed of a transparent plastic material. The plastic material may be at least one organic material selected from polyether sulfone (PES), polyarylate (PAR), polyether imide (PEI), polyethylene naphthalate (PEN), polyethylene terephthalate (PET), polyphenylene sulfide (PPS), polyacrylate, polyimide, polycarbonate (PC), cellulose triacetate (TAC), and cellulose acetate propionate (CAP), each of which are insulating organic materials.

Also, since the substrate 100 is formed of a flexible material, the substrate 100 may extend in two dimensions. In one embodiment, the substrate 100 may be formed of a material having a Poisson's ratio of about 0.4 or more. The Poisson's ratio denotes the ratio of transverse contraction strain to longitudinal extension strain in the direction of a stretching force (e.g., the ratio of transverse compression to axial expansion).

When a material forming the substrate 100 has a Poisson's ratio of about 0.4 or more, the substrate 100 may have suitable stretching characteristics, the flexibility of the substrate 100 may be improved, and a shape of the display device 1000 may be easily changed.

The buffer layer 110 may prevent or reduce diffusion of impurity ions and/or intrusion of external moisture and/or air (e.g., oxygen) into the display portion 200, and may function as a barrier layer and/or a blocking layer for planarization of the substrate 100. The buffer layer 110 may include, for example, inorganic materials (such as silicon oxide, silicon nitride, silicon oxynitride, aluminum oxide, aluminum nitride, titanium oxide, and/or titanium nitride) or organic materials (such as polyimide, polyester, and/or acrylic), and may have a multilayer structure including a plurality of the above materials.

The display portion 200 over the substrate 100 will be described in more detail with reference to FIG. 3.

The display portion 200 may include, for example, a thin film transistor (TFT) and a display element (such as an organic light-emitting device (OLED)). However, embodiments of the present disclosure are not limited thereto, and the display portion 200 may include one or more suitable types or kinds of display devices (such as a liquid crystal display device). However, for convenience of explanation, in the following description, the display portion 200 according to the present embodiment includes an OLED.

A TFT may be on the substrate 100. The TFT may include a semiconductor layer A, a gate electrode G, a source electrode S, and a drain electrode D. FIG. 3 illustrates a top gate-type TFT (e.g., top gate TFT) sequentially including the semiconductor layer A, the gate electrode G, the source electrode S, and the drain electrode D. However, embodiments of the present disclosure are not limited thereto, and one or more suitable types or kinds of TFTs (such as a bottom gate-type TFT or bottom gate TFT) may be employed.

The semiconductor layer A may be formed of an inorganic semiconductor material (such as silicon) or an organic semiconductor material. The semiconductor layer A may have a source region, a drain region, and a channel region between the source region and the drain region. For example, when the semiconductor layer A is formed using amorphous silicon, an amorphous silicon layer may be on the entire surface of the substrate 100 and may then be crystallized to form a polycrystalline silicon layer. After the polycrystalline silicon layer is patterned, the source region and the drain region at the edges thereof may be doped with impurities, thereby forming the semiconductor layer A including the source region, the drain region, and the channel region therebetween.

After the semiconductor layer A is formed, a gate insulating film 210 may be positioned on the semiconductor layer A and on and above the entire surface of the substrate 100. The gate insulating film 210 may be formed of an inorganic material (such as silicon oxide and/or silicon nitride) in a multilayer or a single layer structure. The gate insulating film 210 insulates the semiconductor layer A from the gate electrode G above the semiconductor layer A.

The gate electrode G may be in a specific area above the gate insulating film 210. The gate electrode G may be connected to a gate line for applying on/off signals to the TFT. The gate electrode G may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu). However, embodiments of the present disclosure are not limited thereto, and the gate electrode G may be formed of one or more suitable materials depending on the design conditions.

After the gate electrode G is formed, an interlayer insulating film 230 for insulating the gate electrode G from the source electrode S and the drain electrode D may be over the entire surface of the substrate 100.

The interlayer insulating film 230 may be formed of an inorganic material. For example, the interlayer insulating film 230 may include a metal oxide and/or a metal nitride. In more detail, an inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZrO_2$).

The interlayer insulating film 230 may be formed of an inorganic material, (such as silicon oxide ($SiO_x$) and/or silicon nitride ($SiN_x$)) in a multilayer or a single layer structure. In some embodiments, the interlayer insulating film 230 may have a dual structure of $SiO_x/SiN_y$ or $SiN_x/SiO_y$.

The source electrode S and the drain electrode D may be on the interlayer insulating film 230. In more detail, the interlayer insulating film 230 and the gate insulating film 210 expose (e.g., include openings corresponding to) the source region and the drain region of the semiconductor layer A. The source electrode S and the drain electrode D contact the exposed source region and drain region of the semiconductor layer A, respectively.

The source electrode S and the drain electrode D may be formed of at least one element selected from Al, Pt, Pd, Ag, Mg, Au, Ni, Nd, Ir, Cr, Li, Ca, Mo, Ti, W, and Cu, in a single layer or a multilayer structure.

The TFT may be electrically connected to the OLED and may apply a signal to the OLED to drive the OLED. The TFT may be protected by coverage with a planarization film 250.

The planarization film 250 may include an inorganic insulating film and/or an organic insulating film. The inorganic insulating film may include $SiO_2$, $SiN_x$, SiON, $Al_2O_3$, $TiO_2$, $Ta_2O_5$, $HfO_2$, $ZrO_2$, BST, or PZT. The organic insulating film may include a commodity polymer (e.g., polymethylmethacrylate (PMMA) or polystyrene (PS)), polymer derivatives having a phenol-based group, an acrylic polymer, an imide-based polymer, an aryl ether-based polymer, an amide-based polymer, a fluorine-based polymer, a p-xylene-based polymer, a vinyl alcohol-based polymer, or a blend thereof. The planarization film 250 may include composite laminates of an inorganic insulating film and an organic insulating film.

The OLED may be above the planarization film 250.

The OLED may include a first electrode 281, an intermediate layer 283 including an organic light-emitting layer, and a second electrode 285. Holes and electrons injected from the first electrode 281 and the second electrode 285 of the OLED, respectively, may combine in the organic light-emitting layer of the intermediate layer 283 to thereby generate light.

The first electrode 281 may be on the planarization film 250, and may be electrically connected to the drain electrode D via a contact hole in the planarization film 250. However, the first electrode 281 is not limited to being electrically connected to the drain electrode D. The first electrode 281 may be electrically connected to the source electrode S and may receive a signal to drive the OLED.

The first electrode 281 may be a reflective electrode, and may include a reflective film formed of Ag, Mg, Al, Pt, Pd, Au, Ni, Nd, Ir, Cr, and/or a compound thereof, and/or a transparent or transflective electrode layer on the reflective film. The transparent or transflective electrode layer may include at least one selected from indium tin oxide (ITO), indium zinc oxide (IZO), zinc oxide (ZnO), indium oxide ($In_2O_3$), indium gallium oxide (IGO), and aluminum zinc oxide (AZO).

The intermediate layer 283 may include the organic light-emitting layer. In one embodiment, the intermediate layer 283 may include the organic light-emitting layer (emission layer) and may further include at least one selected from a hole injection layer (HIL), a hole transport layer, an electron transport layer, and an electron injection layer. However, embodiments of the present disclosure are not limited thereto, and the intermediate layer 283 may include the organic light-emitting layer and one or more other functional layers.

The second electrode 285 may be on the intermediate layer 283. The second electrode 285 may form an electric field with the first electrode 281 so that the intermediate layer 283 may emit light. The first electrode 281 may be patterned for each pixel, and the second electrode 285 may be formed such that a voltage is applied to each and every pixel.

The second electrode 285 facing the first electrode 281 may be a transparent or transflective electrode, and may include a metal thin film having a low work function (such as Li, Ca, LiF/Ca, LiF/Al, Al, Ag, Mg, and/or a compound thereof). An additional auxiliary electrode layer or a bus electrode may be on the metal thin film of the transparent electrode and may be formed of a material such as ITO, IZO, ZnO, and/or $In_2O_3$.

Accordingly, the second electrode 285 may transmit the light emitted from the organic light-emitting layer in the intermediate layer 283. In other words, the light emitted from the organic light-emitting layer may be directly emitted toward the second electrode 285, or may be reflected by the first electrode 281 (which may be a reflective electrode) to proceed toward the second electrode 285.

However, the display portion 200 according to the present embodiment is not limited to being a top emission type (e.g., top emission display), and may be a bottom emission type (e.g., bottom emission display), in which the light emitted from the organic light-emitting layer proceeds toward the substrate 100. In this case, the first electrode 281 may be a transparent or transflective electrode, and the second electrode 285 may be a reflective electrode. In some embodiments, the display portion 200 may be a dual emission type (e.g., dual emission display), in which light is emitted (e.g., simultaneously) from both the top and bottom of a display device.

In one embodiment, the first electrode 281 may be patterned, for example, to correspond to each pixel. The display portion 200 may further include a pixel defining film 270 on the first electrode 281. The pixel defining film 270 may include an opening 270a exposing the first electrode 281. The intermediate layer 283 is within the opening 270a and may be electrically connected to the first electrode 281. The pixel defining layer 270 may be formed of one or more organic insulation materials selected from polyimide, polyamide, acrylic resin, benzocyclobutene, and phenol resin using a method such as spin coating.

As illustrated in FIG. 2A, a protection layer 300 may be above the display portion 200. In one embodiment, the protection layer 300 may include a capping layer 310 covering the second electrode 285 and a blocking layer 330 on the capping layer 310.

In the method of manufacturing a display device according to the present embodiment, the second electrode 285 may be formed first, then the capping layer 310 may cover the second electrode 285.

The capping layer 310 may protect the OLED and facilitate efficient light emission from the OLED.

In one embodiment, the capping layer 310 may be formed of an organic material (such as α-NPD, NPB, TPD, m-MTDATA, $Alq_3$, and/or CuPc).

Next, the blocking layer 330 may be on the capping layer 310.

In one embodiment, the blocking layer 330 may be formed of an inorganic material (such as LiF, $MgF_2$, and/or $CaF_2$). The blocking layer 330 may block plasma used in the process of forming a first layer 410 (described later) from being introduced into the OLED, thereby preventing or reducing damage to the intermediate layer 283 and the second electrode 285.

In one embodiment, the blocking layer 330 may be formed of lithium fluoride (LiF) having a pin-hole structure.

However, embodiments of the present disclosure are not limited to this example. Although FIG. 2A illustrates an embodiment in which the protection layer 300 including the capping layer 310 and the blocking layer 330 is formed above the display portion 200, embodiments of the present disclosure are not limited thereto, and only one of the capping layer 310 and the blocking layer 330 may be formed, or none of the capping layer 310 and the blocking layer 330 may be formed.

Next, in order to protect the display portion 200 from external oxygen and/or moisture, an encapsulation portion 400 (see FIG. 2F) that completely seals the display portion 200 may be formed.

In one embodiment, the encapsulation portion 400 may be above the display portion 200, and opposite end portions of the encapsulation portion 400 may closely contact the substrate 100, thereby completely or substantially sealing the display portion 200.

In one embodiment, the encapsulation portion 400 may have a structure of a stacked plurality of thin film layers, in which at least one of an inorganic film and at least one of an organic film are alternately stacked.

The inorganic film of the encapsulation portion 400 may prevent or reduce intrusion of oxygen and/or moisture, whereas the organic film of the encapsulation portion 400 may absorb stress from the inorganic film and provide flexibility.

Figure 2B:
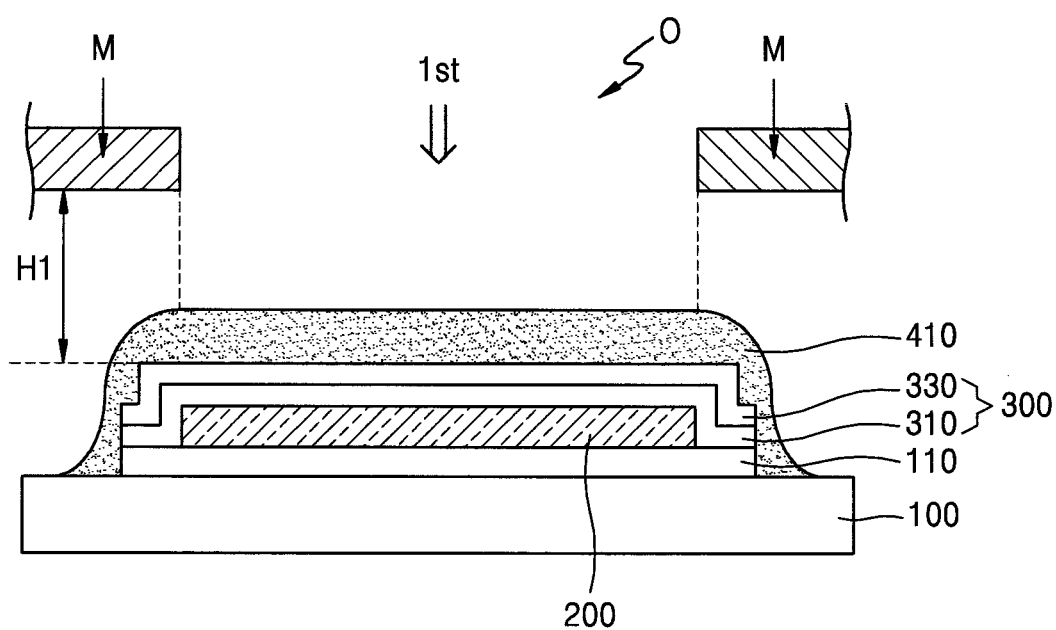

First, as illustrated in FIGS. 2A and 2B, a first layer 410 may be formed ($1^{st}$).

The first layer 410 may be formed when a mask M and a surface where the first layer 410 is to be deposited are spaced apart from each other by a first interval H1.

In the method of manufacturing a display device according to the present embodiment, since the capping layer 310 and the blocking layer 330 are sequentially deposited on the display portion 200, the first interval H1 may be between an upper surface of the blocking layer 330 and the mask M. However, this is merely an example, and when the protection layer 300 is not formed, the first interval H1 may be between an upper surface of the display portion 200 to the mask M.

In the method of manufacturing a display device according to the present embodiment, in forming the first layer 410, the mask M is spaced apart by the first interval H1 from a surface where the first layer 410 is to be formed. Accordingly, the first layer 410 may not be confined to a position corresponding to opening O of the mask M, but may be in a large or wide area under the mask M.

In other words, the first layer 410 may have a width greater than the width of the opening O of the mask M.

In one embodiment, the first layer 410 may have a wide area so that an edge of the first layer 410 may closely contact the substrate 100. In other words, opposite end portions of the first layer 410 may contact the substrate 100, thereby completely sealing the display portion 200.

The first layer 410 may be a single layer or a multilayer structure including an oxide and/or a metal nitride.

In one embodiment, the first layer 410 may be formed of an inorganic material. For example, the first layer 410 may be formed of at least one selected from $SiN_x$, $Al_2O_3$, $SiO_x$, SiON, SiCN, $TiO_x$, $WO_x$, $SiO_xC_y$, and $SiO_xC_yH_z$.

In one embodiment, the first interval H1 between the mask M and the surface where the first layer 410 is to be deposited may be about 1 μm to 300 μm. When the capping layer 310 and the blocking layer 330 are sequentially deposited on the display portion 200, the distance from the upper surface of the blocking layer 330 to the mask M may be about 1 μm to 300 μm. When the protection layer 300 is not on the display portion 200, the distance from the upper surface of the display portion 200 to the mask M may be about 1 μm to 300 μm.

In one embodiment, the first layer 410 may be deposited by a chemical vapor deposition (CVD) method to have a set or certain thickness.

Figure 2C:
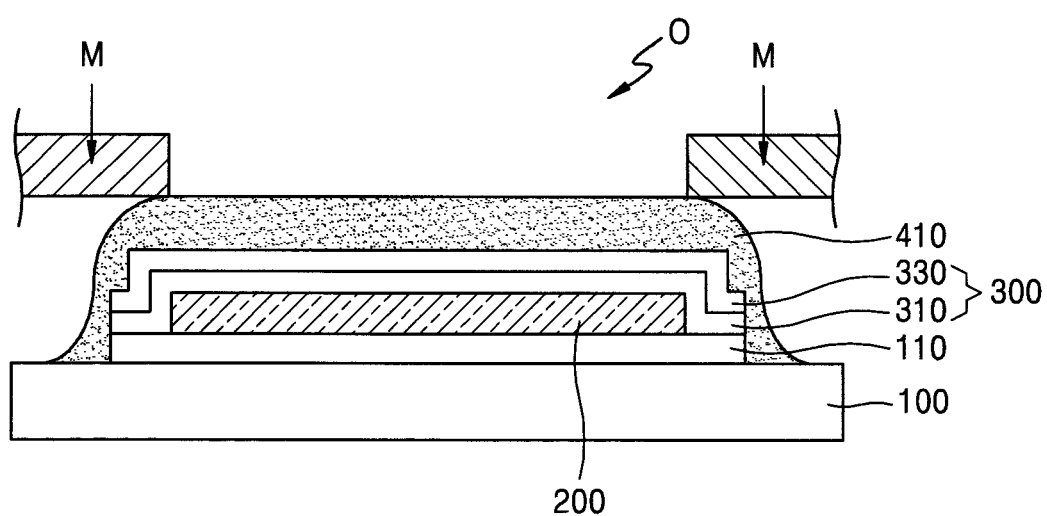
Figure 2D:
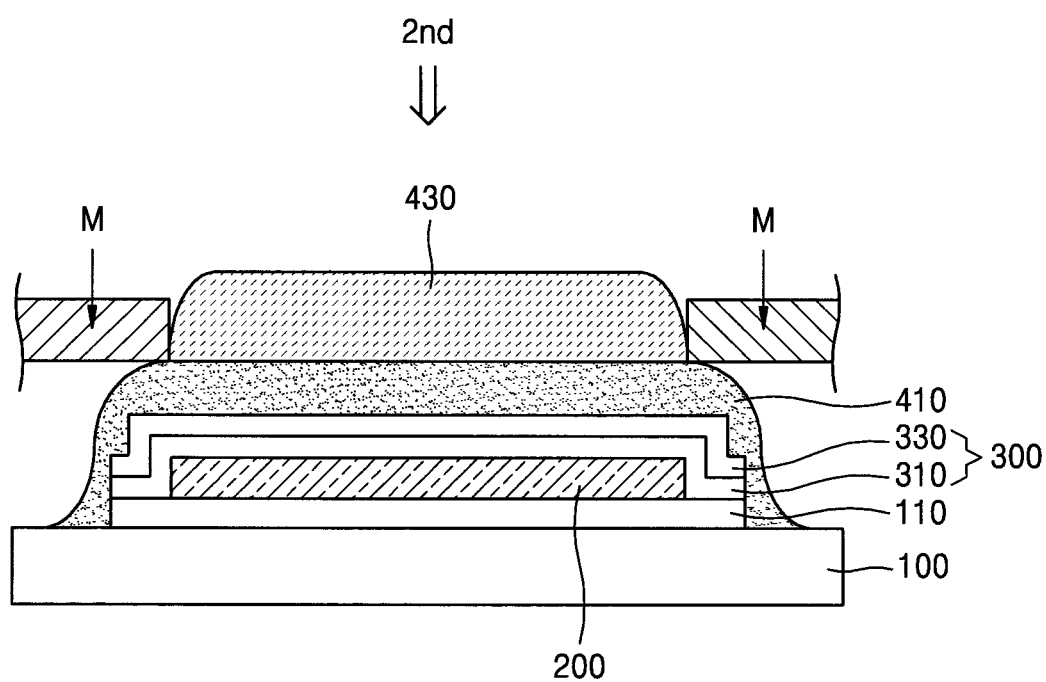

Next, referring to FIGS. 2C and 2D, a second layer 430 may be on the first layer 410 ($2^{nd}$).

The second layer 430 may be formed using the same mask M used for forming the first layer 410. In other words, the first layer 410 and the second layer 430 may each be formed by adjusting an interval (e.g., selecting a suitable interval for each) between the mask M and the surface subject to deposition.

The second layer 430 may be formed by maintaining a distance of a second interval different from the first interval H1 between the mask M and an upper surface of the first layer 410.

In the method of manufacturing a display device, according to the present embodiment, the second interval may be about 0 μm. In other words, as illustrated in FIGS. 2C and 2D, the second layer 430 may be formed when the mask M contacts the upper surface of the first layer 410.

When the second layer 430 is formed while the mask M contacts the upper surface of the first layer 410, the second layer 430 may have a width that is substantially the same as or less than the width of the opening O of the mask M.

In one embodiment, a thickness of a center portion of the second layer 430 may be greater than a thickness of an edge portion of the second layer 430.

The second layer 430 may be formed of a material different from that of the first layer 410.

The second layer 430 may be formed of an organic and/or inorganic composite material. When the second layer 430 is formed of an organic and/or inorganic composite material, the intrusion of oxygen and/or moisture may be prevented or reduced, and flexibility may be provided.

In one embodiment, the second layer 430 may be formed of at least one material selected from hexamethyldisiloxane (HMDSO), hexamethyldisilazane (HMDSN), tetramethyldisiloxane (TMDSO), tetraethylorthosilicate (TEOS), octamethylcyclotetrasiloxane (OMCTS), and tetraoxymethylcyclotetrasiloxane (TOMCTS).

However, the material forming the second layer 430 is not limited to the above-described materials, and any material may be used as long as the material is flexible and can be formed using the mask M.

In one embodiment, the second layer 430 may be formed by a CVD method to have a set or certain thickness.

Figure 2E:
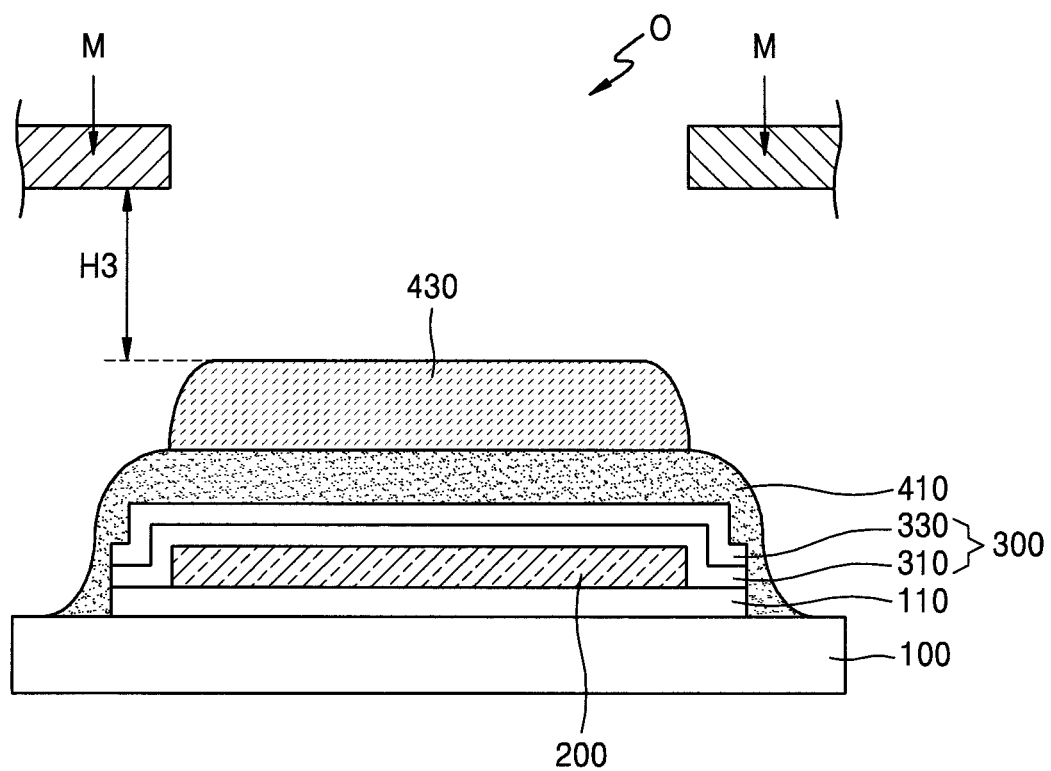
Figure 2F:
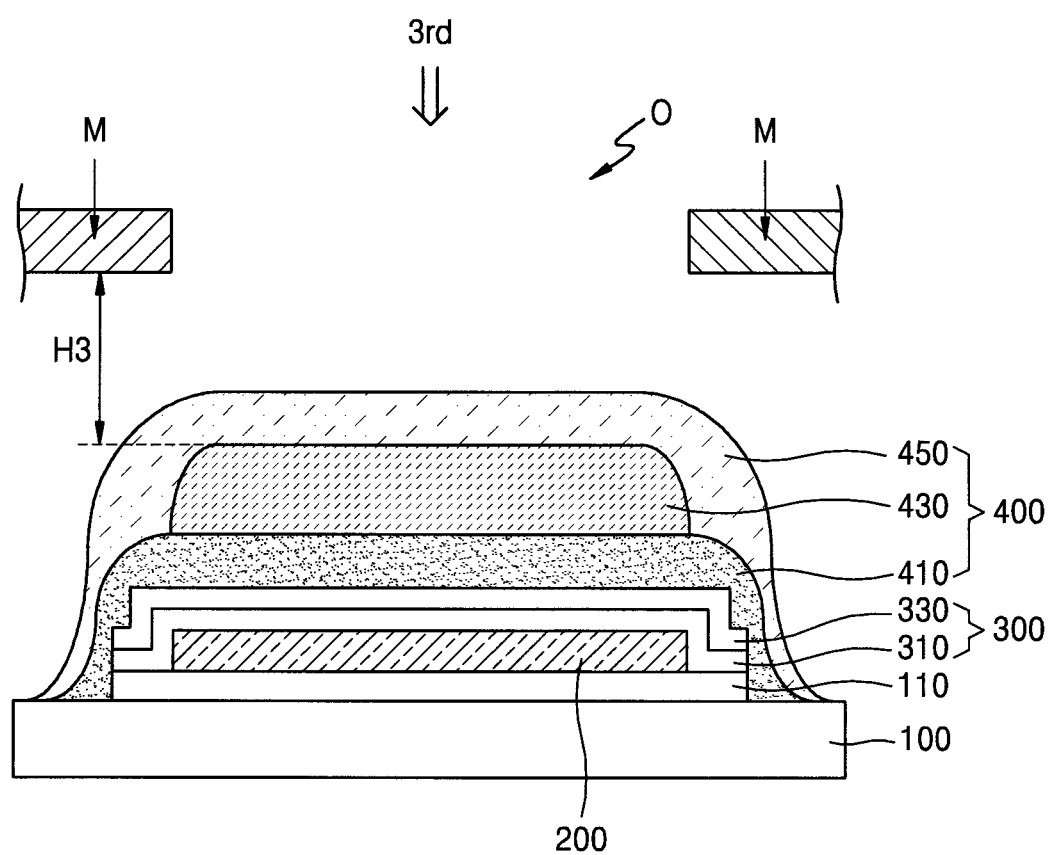

Next, referring to FIGS. 2E and 2F, a third layer 450 may be on the second layer 430 ($3^{rd}$).

The third layer 450 may be formed using the same mask M used for forming the second layer 430. In other words, the first layer 410, the second layer 430, and the third layer 450 may be formed using the same mask M.

The third layer 450 may be formed using the same mask M used for forming the second layer 430 and by adjusting an interval (e.g., selecting a suitable interval) between the mask M and the surface subject to deposition.

The third layer 450 may be maintaining a distance of a third interval H3 different from the second interval H2 between the mask M and an upper surface of the second layer 430.

In the method of manufacturing a display device, according to the present embodiment, when the third layer 450 is formed, the mask M is spaced apart from the upper surface of the second layer 430 by the third interval H3. Accordingly, the third layer 450 may not be confined to a position corresponding to the opening O of the mask M, but may be in a large or wide area under the mask M.

In other words, the third layer 450 may have a width greater than the width of the opening O of the mask M.

In one embodiment, the third interval H3 may be about 1 μm to 300 μm. In other words, the third layer 450 may be formed while maintaining the distance between the upper surface of the second layer 430 and the mask M to be about 1 μm to 300 μm.

In one embodiment, the third interval H3 may be the same as the first interval H1.

In one embodiment, the third interval H3 may be greater than the first interval H1.

As illustrated in FIGS. 2E and 2F, the width of the third layer 450 may be greater than the width of the first layer 410.

The third layer 450 may have a large or wide area so that an edge of the third layer 450 may closely contact the substrate 100. In other words, opposite end portions of the third layer 450 may contact the substrate 100, thereby completely sealing the display portion 200.

In one embodiment, the third layer 450 may be formed to contact the first layer 410 at the edge of the first layer 410. In other words, as illustrated in FIG. 2F, the first layer 410 and the third layer 450 may encompass (e.g., encapsulate or surround) the second layer 430.

The third layer 450 may be a single layer or a multilayer structure including an oxide and/or a metal nitride.

In one embodiment, the third layer 450 may be formed of an inorganic material. For example, the third layer 450 may be formed of at least one selected from $SiN_x$, $Al_2O_3$, $SiO_x$, SiON, SiCN, $TiO_x$, $WO_x$, $SiO_xC_y$, and $SiO_xC_yH_z$.

In this state, the third layer 450 may be formed of the same material as the material of the first layer 410. However, embodiments of the present disclosure are not limited thereto, and the third layer 450 may be formed of a different material from the material of the first layer 410.

In one embodiment, the third layer 450 may be formed using a CVD method to have a set or certain thickness.

In the display device manufactured by the method according to the present embodiment, as illustrated in FIG. 2F, although the encapsulation portion 400 includes the first layer 410, the second layer 430, and the third layer 450, the number of layers forming the encapsulation portion 400 is not limited thereto and the encapsulation portion 400 may additionally include a plurality of layers. However, the additional layers may be formed using the same mask M and by adjusting the interval between the mask M and a target surface. Also, the additional layer formed on the top of the third layer 450 may be formed so that the edge of the layer may closely contact the substrate 100 by maintaining a wide interval between the mask M and the target surface to be formed.

In the method of manufacturing a display device, according to the present embodiment, as illustrated in FIGS. 2A to 2F, when a plurality of layers formed of an inorganic material or an organic and/or inorganic composite material, (e.g., the first layer 410, the second layer 430, and the third layer 450) may be formed using the single mask M, the number of masks may be reduced and thus a manufacturing process may be simplified.

Also, since the encapsulation portion 400 having superior sealing function and superior flexibility may be formed by simply adjusting the position of the mask M (e.g., the interval between the mask M and the target surface), a display device having improved reliability may be formed.

In other words, in the display device manufactured by the method according to the present embodiment, the encapsulation portion 400 includes the first layer 410, the second layer 430, and the third layer 450, in which the edges of the first layer 410 and the third layer 450 contact the substrate 100, completely encompassing (e.g., enclosing or surrounding) the second layer 430. Accordingly, the intrusion of external moisture and/or oxygen through the side surface of the second layer 430 formed of an organic and/or inorganic composite material may be prevented or reduced, and the reliability of the display device may be improved.

In the method of manufacturing a display device, according to the present embodiment, since all of the first layer 410, the second layer 430, and the third layer 450 are formed by a CVD method, the first layer 410, the second layer 430, and the third layer 450 may be formed in the same chamber. Accordingly, the distance that the substrate 100 is moved during the manufacturing process is remarkably reduced and the manufacturing process may be simplified.

Figure 4A:
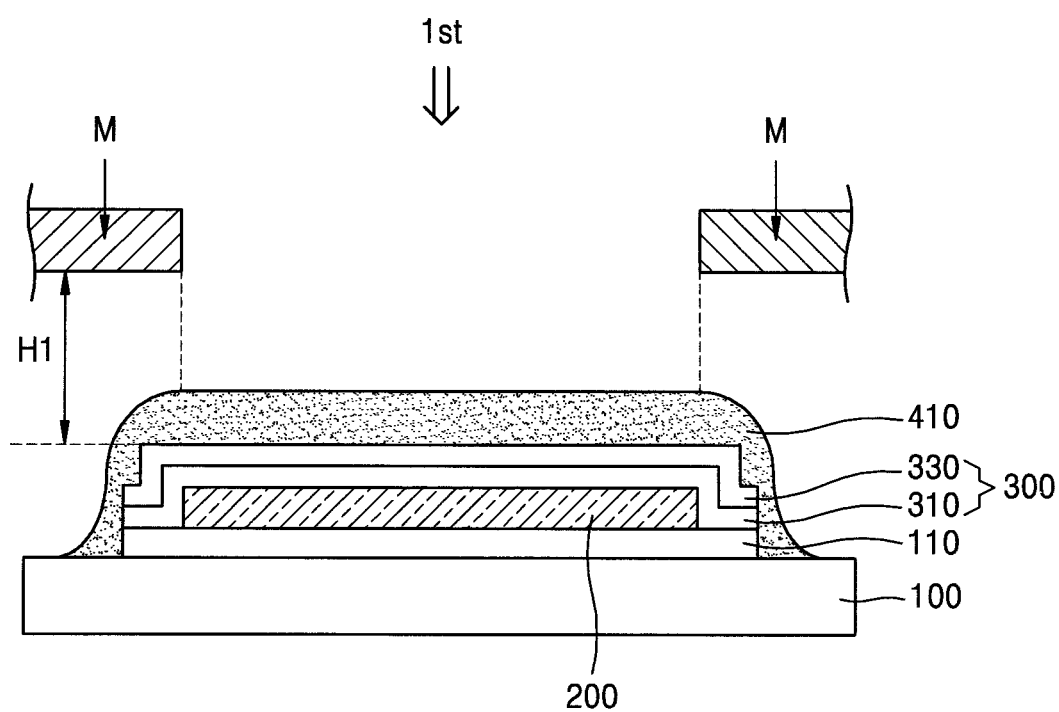
FIGS. 4A to 4C are cross-sectional views sequentially illustrating a method of manufacturing a display device, according to another embodiment of the present disclosure.
Figure 4B:
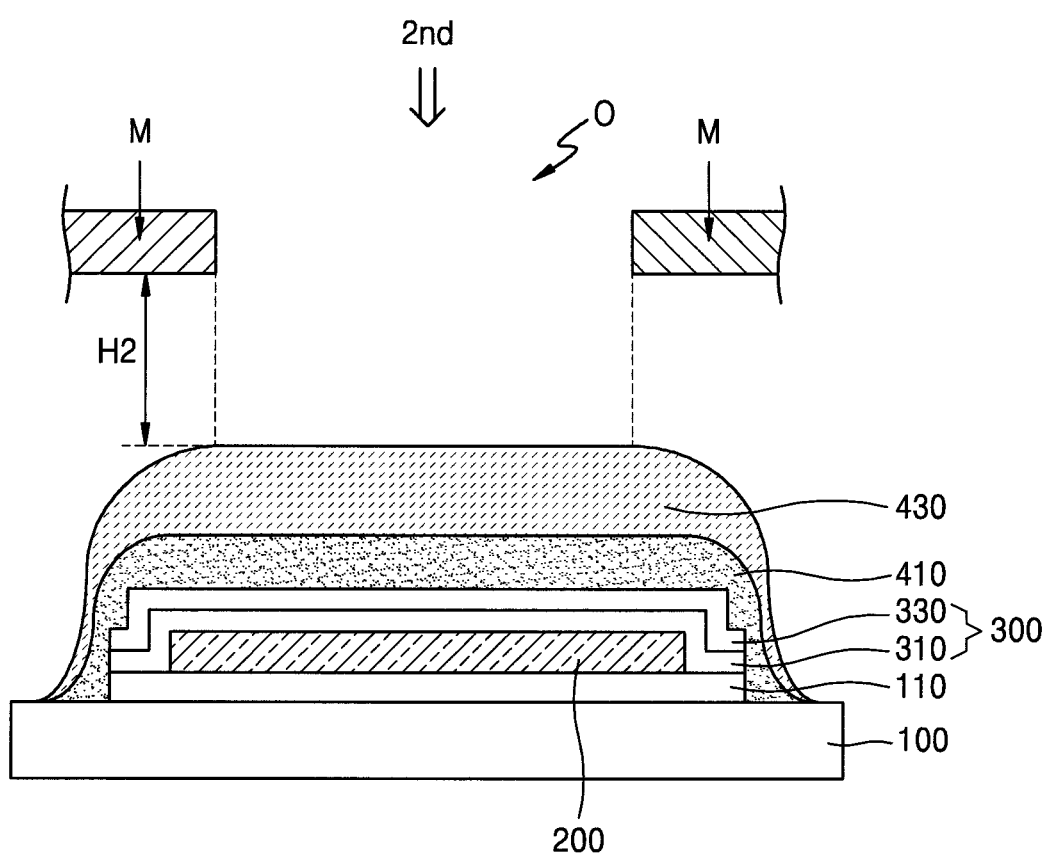
Figure 4C:
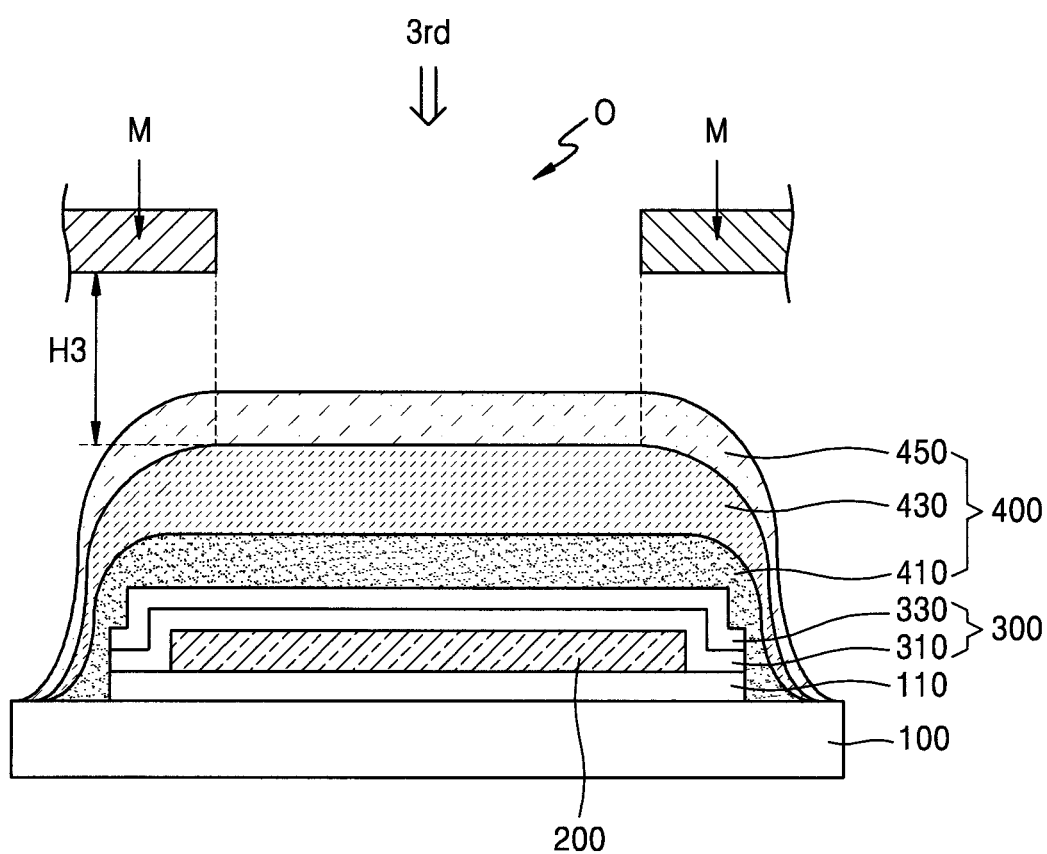

FIGS. 4A to 4C are cross-sectional views sequentially illustrating a display device manufactured by a method according to another embodiment. In FIGS. 4A to 4C, reference numerals that are the same as those in FIGS. 1 to 3 denote the same elements, and duplicative descriptions thereof may not be provided.

First, referring to FIG. 4A, the display portion 200 may be above the substrate 100, and the protection layer 300 may be on the display portion 200.

Next, the first layer 410 may be on the protection layer 300.

The first layer 410 may be formed by maintaining a distance of the first interval H1 between the mask M and a surface of the first layer 410 (1$^{st}$).

In the method of manufacturing a display device, according to the present embodiment, since the first layer 410 is formed when the mask M is spaced apart from the surface subject to deposition by the first interval H1, the first layer 410 may not be confined to a position corresponding to opening O of the mask M, but may be in a large or wide area under the mask M.

In other words, the first layer 410 may have a width greater than the width of the opening O of the mask M.

In one embodiment, the first layer 410 may have a large or wide area so that the edge of the first layer 410 may closely contact the substrate 100. In other words, opposite end portions of the first layer 410 may contact the substrate 100, and thus the first layer 410 may be on the substrate 100 to completely seal the display portion 200.

The first layer 410 may be a single layer or a multilayer structure including an oxide and/or a metal nitride.

In one embodiment, the first layer 410 may be formed of an inorganic material. For example, the first layer 410 may be formed of at least one selected from $SiN_x$, $Al_2O_3$, $SiO_x$, SiON, SiCN, $TiO_x$, $WO_x$, $SiO_xC_y$, and $SiO_xC_yH_z$.

In one embodiment, the first interval H1 may be about 1 μm to 300 μm. In other words, when the capping layer 310 and the blocking layer 330 are sequentially stacked on and above the display portion 200, a distance from the upper surface of the blocking layer 330 to the mask M may be about 1 μm to 300 μm. When the protection layer 300 is not on the display portion 200, the distance from the upper surface of the display portion 200 to the mask M may be about 1 μm to 300 μm.

In one embodiment, the first layer 410 may be formed by a CVD method to have a set or certain thickness.

Next, referring to FIG. 4B, the second layer 430 may be on the first layer 410.

The second layer 430 may be formed using the same mask M used for forming the first layer 410. In other words, the first layer 410 and the second layer 430 may each be formed using the same mask M and by adjusting the interval between the mask M and the surface subject to deposition (2$^{nd}$).

The second layer 430 may be formed by maintaining a distance of the second interval H2 that is different from the first interval H1 between the mask M and the upper surface of the first layer 410.

In one embodiment, the second interval H2 may be greater than the first interval H1. In other words, the second layer 430 may be formed using the mask M at a second interval H2 greater than the first interval H1 from the upper surface of the first layer 410.

Accordingly, as illustrated in FIG. 4B, the width of the second layer 430 may be greater than the width of the first layer 410.

In one embodiment, a difference between the second interval H2 and the first interval H1 may be greater than 0 mm and less than or equal to 1 mm.

In the method of manufacturing a display device, according to the present embodiment, since the second layer 430 is formed when the mask M is spaced apart from the upper surface of the first layer 410 by the second interval H2, the second layer 430 may not be confined to an area corresponding to the opening O of the mask M, but may also be in a wide area under the mask M.

In other words, the second layer 430 may have a width greater than the width of the opening O of the mask M.

In one embodiment, the second layer 430 may be formed to have a large or wide area so that the edge of the second layer 430 may closely contact the substrate 100. In other words, the second layer 430 may be on the substrate 100 such that opposite end portions of the second layer 430 may contact the substrate 100.

The second layer 430 may be formed of a material that is different from the material of the first layer 410.

The second layer 430 may be formed of an organic and/or inorganic composite material.

In one embodiment, the second layer 430 may be formed of at least one material selected from hexamethyldisiloxane (HMDSO), hexamethyldisilazane (HMDSN), tetramethyldisiloxane (TMDSO), tetraethylorthosilicate (TEOS), octamethylcyclotetrasiloxane (OMCTS), and tetraoxymethylcyclotetrasiloxane (TOMCTS).

However, the material for forming the second layer 430 is not limited to the above materials, and any flexible material that may be formed using the mask M may be employed.

In one embodiment, the second layer 430 may be formed by a CVD method to have a set or certain thickness.

Next, referring to FIG. 4C, the third layer 450 may be on the second layer 430.

The third layer 450 may be formed using the same mask M used for forming the second layer 430. In other words, the second layer 430 and the third layer 450 may be formed using the same mask M and by adjusting the interval between the mask M and the surface subject to deposition.

The third layer 450 may be formed by maintaining the distance of a third interval H3 different from the second interval H2 between the mask M and the upper surface of the second layer 430 ($3^{rd}$).

In one embodiment, the third interval H3 may be greater than the second interval H2. In other words, the third layer 450 may be formed using the distance of a third interval H3 that is greater than the second interval H2 between the mask M and the upper surface of the second layer 430.

Accordingly, as illustrated in FIG. 4C, the width of the third layer 450 may be greater than the width of the second layer 430.

The third interval H3 may be greater than the second interval H2, and the second interval H2 may be greater than the first interval H1. Accordingly, as illustrated in FIG. 4C, the width of the third layer 450 may be greater than the width of the second layer 430 and the width of the first layer 410.

In one embodiment, a difference between the third interval H3 and the second interval H2 may be greater than 0 mm and less than or equal to 1 mm.

The third layer 450 may be a single layer or a multilayer structure including an oxide and/or a metal nitride.

In one embodiment, the third layer 450 may be formed of an inorganic material. For example, the first layer 410 may be formed of at least one selected from $SiN_x$, $Al_2O_3$, $SiO_x$, SiON, SiCN, $TiO_x$, $WO_x$, $SiO_xC_y$, and $SiO_xC_yH_z$.

In this state, the third layer 450 may be formed of the same material as the material of the first layer 410. However, embodiments of the present disclosure are not limited thereto, and the third layer 450 may be formed of a material different from the material of the first layer 410.

In the method of manufacturing a display device, according to the present embodiment, since the third layer 450 is formed when the mask M is spaced apart from the upper surface of the second layer 430 by the third interval H3, the third layer 450 may not be confined to an area corresponding to the opening O of the mask M, but may also be in a wide area under the mask M.

In other words, the third layer 450 may be formed to have a width greater than the width of the opening O of the mask M.

In one embodiment, the third layer 450 may be formed to have a large or wide area so that the edge of the third layer 450 closely contacts the substrate 100. In other words, opposite end portions of the third layer 450 may be on the substrate 100 to contact the substrate 100.

In the display device manufactured by the method according to the present embodiment, opposite end portions of each of the first layer 410, the second layer 430, and the third layer 450 may be formed to closely contact the substrate 100.

Also, the edge of the first layer 410 contacts the edge of the second layer 430, and the edge of the second layer 430 contacts the edge of the third layer 450.

In other words, since the second layer 430 is formed to surround (e.g., encapsulate) the substrate 100, the first layer 410, and the third layer 450, the intrusion of moisture and/or oxygen through the side surface of the second layer 430 may be prevented or reduced, and thus the reliability of the display device may be improved.

In one embodiment, the third layer 450 may be formed by a CVD method to have a set or certain thickness.

In the display device manufactured by the method according to the present embodiment, as illustrated in FIG. 4C, although the encapsulation portion 400 includes the first layer 410, the second layer 430, and the third layer 450, the number of layers forming the encapsulation portion 400 is not limited thereto, and the encapsulation portion 400 may additionally include a plurality of layers. The additional layers may be formed using the same mask M and by adjusting the interval between the mask M and a target surface. Also, the additional layer(s) formed on the top of the third layer 450 may be formed so that the edge(s) of the layer(s) closely contact the substrate 100 (e.g., by maintaining a wide or non-zero interval between the mask M and the target surface to be formed).

In the method of manufacturing a display device according to the present embodiment, as illustrated in FIGS. 4A to 4C, since a plurality of layers formed of an inorganic material or an organic and/or inorganic composite material (e.g., the first layer 410, the second layer 430, and the third layer 450) may be formed using only one mask M, the number of masks may be reduced and thus the manufacturing process may be simplified.

Also, the encapsulation portion 400 having superior sealing function and superior flexibility may be formed using only one mask M and by adjusting the position of the mask M. Accordingly, a display device having improved reliability may be formed.

In other words, in the display device manufactured by the method according to the present embodiment, since the edges of each of the first layer 410, the second layer 430, and the third layer 450 (which are included in the encapsulation portion 400) contact the substrate 100, and the second layer 430 is completely surrounded (e.g., enclosed) by the substrate 100, the first layer 410, and the third layer 450, the intrusion of external moisture and/or oxygen through the side surface of the second layer 430 formed of an organic and/or inorganic composite material may be prevented or reduced, and the reliability of the display device may be improved.

In the method of manufacturing a display device, according to the present embodiment, since all of the first layer 410, the second layer 430, and the third layer 450 may be formed by a CVD method in the same chamber, the distance that the substrate 100 is moved during the manufacturing process may be remarkably reduced and thus the manufacturing process may be simplified.

According to the present disclosure, it is beneficial that the number of masks during formation of a thin film encapsulation portion may be reduced.

Also, it is beneficial that a thin film encapsulation portion having superior sealing and flexibility may be formed.

It should be understood that the embodiments described herein should be considered in a descriptive sense only and not for purposes of limitation. Descriptions of features or aspects within each embodiment should typically be considered as being available for other similar features or aspects in other embodiments.

Further, the use of "may" when describing embodiments of the present disclosure refers to "one or more embodiments of the present disclosure".

In addition, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the drawings, it will be understood by those of ordinary skill in the art that various changes in form and details may be made therein without departing from the spirit and scope as defined by the following claims and equivalents thereof.

What is claimed is:

1. A method of manufacturing a display device, the method comprising:
    forming a display portion on a substrate; and
    forming an encapsulation portion for sealing the display portion,
    wherein the forming of the encapsulation portion comprises:
        forming a first layer covering the display portion;
        forming a second layer on the first layer; and
        forming a third layer on the second layer,
    wherein the first layer is formed by maintaining a distance between an upper surface of the display portion and a mask by a first interval,
    the second layer is formed by maintaining a distance of a second interval different from the first interval between an upper surface of the first layer and the mask, and
    the third layer is formed by maintaining a distance of a third interval different from the second interval between an upper surface of the second layer and the mask.

2. The method of claim 1, wherein the first layer and the third layer each comprise an inorganic material, and the second layer comprises an organic and/or inorganic composite material that is different from the material of each of the first layer and the third layer.

3. The method of claim 2, wherein the second layer comprises at least one selected from hexamethyldisiloxane (HMDSO), hexamethyldisilazane (HMDSN), tetramethyldisiloxane (TMDSO), tetraethylorthosilicate (TEOS), octamethylcyclotetrasiloxane (OMCTS), and tetraoxymethylcyclotetrasiloxane (TOMCTS).

4. The method of claim 2, wherein the inorganic material is at least one selected from $SiN_x$, $SiO_x$, SiON, SiCN, $TiO_x$, $WO_x$, $SiO_xC_y$, and $SiO_xC_yH_z$.

5. The method of claim 1, wherein the first layer, the second layer, and the third layer are each formed in the same chamber.

6. The method of claim 1, wherein each of the first interval and the third interval is about 1 μm to 300 μm.

7. The method of claim 6, wherein the third interval is greater than the second interval.

8. The method of claim 7, wherein the third interval is greater than the first interval, and the first interval is greater than the second interval.

9. The method of claim 8, wherein the third layer and the first layer are formed such that edges of the third layer and the first layer contact each other, and the third layer and the first layer encompass the second layer.

10. The method of claim 8, wherein a width of the third layer is greater than a width of the first layer, and the third layer contacts the substrate at an edge of the first layer.

11. The method of claim 8, wherein the second layer is formed when the mask contacts the upper surface of the first layer.

12. The method of claim 7, wherein the third interval is the same as the first interval.

13. The method of claim 12, wherein the third layer and the first layer are formed such that the edges of the third layer and the first layer contact each other, and the third layer and the first layer encompass the second layer.

14. The method of claim 12, wherein the second layer is formed when the mask contacts the upper surface of the first layer.

15. The method of claim 7, wherein the second interval is greater than the first interval.

16. The method of claim 15, wherein each of the first layer, the second layer, and the third layer has an edge contacting an outer region of the substrate.

17. The method of claim 15, wherein the substrate, the first layer, and the third layer encompass the second layer.

18. The method of claim 15, wherein a difference between the second interval and the first interval and a difference between the third interval and the second interval are each less than or equal to 1 mm.

19. The method of claim 4, wherein the display portion comprises a thin film transistor and a display element electrically connected to the thin film transistor, and
    the display element comprises an organic light-emitting device comprising a first electrode electrically connected to the thin film transistor, a second electrode facing the first electrode, and an intermediate layer between the first electrode and the second electrode.

20. The method of claim 19, wherein the display portion further comprises a protection layer on the second electrode, and the protection layer comprises a capping layer and a blocking layer.

21. The method of claim 20, wherein the first layer is formed by maintaining the first interval between an upper surface of the blocking layer and the mask.

22. A method of manufacturing a display device, the method comprising:
forming a display portion on a substrate; and
forming an encapsulation portion for sealing the display portion,
wherein the forming of the encapsulation portion comprises:
forming a first layer covering the display portion;
forming a second layer on the first layer; and
forming a third layer on the second layer,
wherein the first layer is formed by maintaining a distance of a first interval between an upper surface of the display portion and a mask,
the second layer is formed when the mask contacts the upper surface of the first layer, and
the third layer is formed by maintaining a distance of a third interval between an upper surface of the second layer and the mask.

23. The method of claim 22, wherein the first layer and the third layer each comprise an inorganic material, and the second layer comprises an organic and/or inorganic composite material that is different from the material of the first layer and the third layer.

24. The method of claim 23, wherein the second layer comprises at least one selected from hexamethyldisiloxane (HMDSO), hexamethyldisilazane (HMDSN), tetramethyldisiloxane (TMDSO), tetraethylorthosilicate (TEOS), octamethylcyclotetrasiloxane (OMCTS), and tetraoxymethylcyclotetrasiloxane (TOMCTS).

25. The method of claim 22, wherein the third layer and the first layer are formed such that the edges of the third layer and the first layer contact each other, and the third layer and the first layer encompass the second layer.

* * * * *